(12) United States Patent
Liu et al.

(10) Patent No.: US 9,996,790 B2
(45) Date of Patent: Jun. 12, 2018

(54) MULTILAYER WIRING COUPLING DUAL INTERFACE CARD CARRIER-BAND MODULE

(71) Applicants: BEIJING BASCH SMARTCARD CO., LTD., Beijing (CN); Caifeng Liu, Zhejiang (CN)

(72) Inventors: Caifeng Liu, Zhejiang (CN); Qigang Lvqiu, Beijing (CN); Danning Wang, Beijing (CN)

(73) Assignee: Beijing Basch Smartcard Co., Ltd., Beijing (CN)

( * ) Notice: Subject to any disclaimer, the term of this patent is extended or adjusted under 35 U.S.C. 154(b) by 0 days. days.

(21) Appl. No.: 15/522,161

(22) PCT Filed: Oct. 10, 2015

(86) PCT No.: PCT/CN2015/091595
§ 371 (c)(1),
(2) Date: Apr. 26, 2017

(87) PCT Pub. No.: WO2016/070698
PCT Pub. Date: May 12, 2016

(65) Prior Publication Data
US 2017/0316301 A1  Nov. 2, 2017

(30) Foreign Application Priority Data

Nov. 6, 2014 (CN) .......................... 2014 1 0638524

(51) Int. Cl.
*G06K 19/06* (2006.01)
*G06K 19/077* (2006.01)

(52) U.S. Cl.
CPC . *G06K 19/07722* (2013.01); *G06K 19/07773* (2013.01)

(58) Field of Classification Search
CPC ....... G06K 19/07722; G06K 19/07743; G06K 19/07747; G06K 19/07749;
(Continued)

(56) References Cited

U.S. PATENT DOCUMENTS 8,763,912 B1    7/2014  Vogt
2008/0314990 A1  12/2008  Rietzler
(Continued)

FOREIGN PATENT DOCUMENTS

CN    101409275 A    4/2009
CN    102024175 A    4/2011
(Continued)

OTHER PUBLICATIONS

International Search Report and Written Opinion, issued by the State Intellectual Property Office of the People's Republic of China (in Chinese language), dated Dec. 28, 2015, for International Application No. PCT/CN2015/091595; 9 pages.

(Continued)

*Primary Examiner* — Seung Lee
(74) *Attorney, Agent, or Firm* — Faegre Baker Daniels LLP

(57) ABSTRACT

A multilayer wiring coupling dual interface card carrier tape module is provided, including: a carrier tape base layer, an electrode diaphragm layer, a tuning capacitance layer, a radio-frequency identification coil layer, a bonding pad and a via hole. One surface of the carrier-band base layer is the front surface of the carrier-band module, and the other surface of the carrier-band base layer is the back surface of the carrier-band module. The electrode diaphragm layer and the tuning capacitance layer are located on the front surface of the carrier-band base layer, and the radio-frequency identification coil layer and the bonding pad are located on the back surface of the carrier-band base layer. The bonding (Continued)

pad is arranged according to a pin position of a chip. Hole metallization processing is conducted on the via hole for realizing an electrical connection between the electrode diaphragm layer and the bonding pad.

15 Claims, 6 Drawing Sheets

(58) Field of Classification Search
CPC ....... G06K 19/07752; G06K 19/07754; G06K 19/07794
USPC .......................................................... 235/492
See application file for complete search history.

(56) References Cited

U.S. PATENT DOCUMENTS

| 2013/0062419 A1 | 3/2013 | Finn et al. |
| 2014/0239428 A1 | 8/2014 | Pueschner et al. |
| 2014/0307405 A1 | 10/2014 | Vogt |
| 2015/0161502 A1 | 6/2015 | Liu et al. |

FOREIGN PATENT DOCUMENTS

| CN | 102543936 A | 7/2012 |
| CN | 102779286 A | 11/2012 |
| CN | 102779286 A | 11/2012 |
| CN | 104021413 A | 9/2014 |
| CN | 104361386 A | 2/2015 |
| CN | 204496538 U | 7/2015 |
| EP | 2869244 A1 | 5/2015 |
| WO | WO9926197 | 5/1999 |

OTHER PUBLICATIONS

English translation of the International Search Report and Written Opinion, issued by the State Intellectual Property Office of the People's Republic of China, dated Dec. 28, 2015, for International Application No. PCT/CN2015/091595; 3 pages.

ISO 11784 & 11785, Wikipedia, Mar. 14, 2013; available on the Internet at https://en.wikipedia.org/w/index.php?title=ISO_11784_%26_11785&oldid=544081158; 4 pages.

ISO/IEC 7816, Wikipedia, May 18, 2014; available on the Internet at https://en.wikipedia.org/w/index.php?title=ISO/IEC_7816&oldid=609071318; 5 pages.

ISO/IEC 15693, Wikipedia, Oct. 23, 2014; available on the Internet at https://en.wikipedia.org/w/index.php?title=ISO/IEC_15693&oldid=630839130; 4 pages.

European Search Report by European Patent Office regarding European Application No. 15857635.5, dated Nov. 13, 2017, 10 pages.

MULTILAYER WIRING COUPLING DUAL INTERFACE CARD CARRIER-BAND MODULE

The present application is a national phase of International Application No. PCT/CN2015/091595 MULTILAYER WIRING COUPLING DUAL INTERFACE CARD CARRIER-BAND MODULE", filed on Oct. 10, 2015, which claims the priority to Chinese Patent Application No. 201410638524.3, titled "MULTILAYER WIRING COUPLING DUAL INTERFACE CARD CARRIER TAPE MODULE", filed on Nov. 6, 2014 with the State Intellectual Property Office of People's Republic of China, both of which are incorporated herein by reference in entireties.

FIELD

The present disclosure relates to the field of an integrated circuit and information interaction, and in particular to a multilayer wiring coupling dual interface card carrier tape module applicable in multiple chip package processes.

BACKGROUND

A dual interface card refers to an Integrated Circuit (IC) card on which interface with an external device is provided in both "contact" and "contactless" manners based on a single chip. The dual interface card has a same appearance as a contact IC card. The dual interface card has a metal contact conforming to the international standard, and the chip may be accessed by contacting the contact. The dual interface card has a similar internal structure as a contactless card. The dual interface card has radio frequency modules such as an antenna and a chip, and the chip may be accessed in a radio frequency mode within a certain distance (within 10 cm). Therefore, the dual interface card has two operation interfaces conforming to two different standards respectively, i.e., a contact interface conforming to a standard of ISO/IEC7816 and a contactless interface conforming to a standard of ISO/IEC15693 or a standard of ISO11784/ISO11785. The two operation interfaces share a same one microprocessor, operating system and Electrically Erasable Programmable Read-Only Memory (EEPROM)/FLASH. Therefore, the dual interface card has advantages of both the contact IC card and the contactless card, and is a multifunction card, which has wide applicability. The dual interface card can satisfy requirements of all in one card and a multi-application card, and can be nearly applied to various types of scenes. Particularly, for a user who originally uses the contactless card or contact IC card system, the user can be upgraded to use the dual interface card by only modifying software, without replacing hardware devices such as a system and a machine tool. Therefore the dual interface card has a limitless market prospect.

Presently, a conventional method for fabricating a dual interface card includes:

(1) providing an electrode diaphragm on a front surface of a carrier tape of the dual interface card, where the electrode diaphragm is configured to communicate data with a reader in a contact manner, so as to achieve a function of a contact IC card;

(2) providing multiple blind holes and two metal contact pads on a back surface of the carrier tape of the dual interface card, where the electrode diaphragm on the front surface of the carrier tape is located at the bottom of the blind holes;

(3) placing a chip of the dual interface card on the back surface of the carrier tape, where the chip is placed forwardly and an active surface of the chip is towards the outside to expose all contact pins and contactless pins of the chip;

(4) connecting multiple of the contact pins of the chip to the electrode diaphragm on the front surface of the carrier tape via the multiple blind holes by using a conventional fly wire bonding process;

(5) connecting two contactless pins of the chip to the two metal contact pads on the back surface of the carrier tape by using a conventional fly wire bonding process;

(6) sealing the chip and the fly wire by packaging with an epoxy adhesive, conventional plastics or ceramics, to form a carrier tape module;

(7) fabricating a wireless Radio Frequency Identification (RFID) antenna of a contactless card;

(8) pressing the RFID antenna into a card base;

(9) milling a slot at a package position of the carrier tape module of the card base, where two ends of the RFID antenna are exposed in the slot;

(10) embedding the carrier tape module of the dual interface card into the milled slot of the card base, where the back surface of the carrier tape module is downward;

(11) connecting the two contactless contact pads on the carrier tape module to the two ends of the RFID antenna in the milled slot by bonding with conductive adhesive or by welding; and

(12) packaging the carrier tape module of the dual interface card in the milled slot, where a surface of the electrode diaphragm on the front surface of the carrier tape module is substantially flush with a surface of the card base.

The dual interface card fabricated using the conventional technology has the following problems.

(1) The pins of the chip are connected to the electrode diaphragm on the front surface of the carrier tape or the contactless metal contact pads on the back surface of the carrier tape by using the conventional fly wire bonding process. The fabrication process is complicated. The chip and the fly wire are sealed by packaging with the epoxy adhesive, plastics or ceramics. It is not beneficial to dissipate thermal energy generated when the IC chip operates, thereby increasing inductance of the chip and reducing an electrical performance of the chip. Multiple elongated fly wires are used, thereby reducing a bandwidth for data transmission, increasing current loss and reducing stability for data transmission.

(2) The two contactless metal contacts of the carrier tape module are connected to the two endpoints of the RFID antenna in the card base in a manual manner, which is difficult. Thus, the production efficiency is low, the connection stability is poor, and a service life is short, failing to satisfy an applicant requirement.

In summary, on one hand, the dual interface card has a wide market prospect; and on the other hand, the method for fabricating the dual interface card in the conventional technology has a great process difficulty and low production efficiency, and the obtained dual interface card has poor quality stability and a short service life. Therefore the market requirement for the dual interface card cannot be satisfied.

SUMMARY

In view of above, a multiplayer wiring coupling dual interface card carrier tape module applicable in multiple chip package processes is provided according to the present disclosure, so as to solve the technical problems existing in the conventional technology.

In order to solve the problems described above, the following technical solutions are provided according to the present disclosure.

A multiplayer wiring coupling dual interface card carrier tape module is provided. The multiplayer wiring coupling dual interface card carrier tape module includes a carrier tape base layer, an electrode diaphragm layer, a tuning capacitance layer, a radio frequency identification RFID coil layer, bonding pads and via holes. The electrode diaphragm layer, the tuning capacitance layer, the carrier tape base layer, the RFID coil layer and the bonding pads are formed as a whole, with both surfaces being clad with metal. One surface of the carrier tape base layer is a front surface of the carrier tape module, the other surface of the carrier tape base layer is a back surface of the carrier tape module, the electrode diaphragm layer and the turning capacitance layer are located on the front surface of the carrier tape base layer, and the RFID coil layer and the bonding pads are located on the back surface of the carrier tape base layer. The bonding pads are arranged according to positions of pins of a chip. The via holes are metallized for electrically connecting the electrode diaphragm layer located on the front surface of the carrier tape module with the bonding pads located on the back surface of the carrier tape module. The electrode diaphragm layer is configured to transmit data in a contact manner. The RFID coil layer matches the tuning capacitance layer to adjust a contactless data transmission frequency of the carrier tape module.

Accordingly, the bonding pads may include first bonding pads, a second bonding pad, a third bonding pad and a fourth bonding pad, and the via holes may include first via holes, second via holes and third via holes. The first via holes may be located in the first bonding pads, the second via holes may be located in the second bonding pad, and the third via holes may be located in the third bonding pad. The second bonding pad may be connected to an outer endpoint of the RFID coil layer, the fourth bonding pad may be connected to an inner endpoint of the RFID coil layer, the second bonding pad and the third bonding pad may be connected to a same one metal contact block on the electrode diaphragm layer via the second via holes and the third via holes respectively, and the first bonding pads may be connected to other metal contact blocks on the electrode diaphragm layer via the first via holes.

Accordingly, the number of the first bonding pads may range from 5 to 8, each of the first bonding pads may correspond to a group of the first via holes, each of the first bonding pads may be connected to different metal contact blocks on the electrode diaphragm layer via the corresponding first via holes. The second bonding pad may correspond to a group of the second via holes, and the third bonding pad may correspond to a group of the third via holes.

Accordingly, the number of the via holes in the group may range from 1 to 5 depending on a diameter of the via hole. The diameter of the via hole may be inversely proportional to the number of the via holes in the group, to enhance stability of electrical connection between the bonding pads and the electrode diaphragm layer.

Accordingly, the diameter of the via hole may range from 0.1 mm to 2 mm.

Accordingly, the via hole may be a blind hole extending from the bonding pad to the electrode diaphragm layer, or a through hole extending from the bonding pad to the electrode diaphragm layer.

Accordingly, the via hole may be formed by using a mechanical mold, a laser engraving technology or a conventional via hole technology.

Accordingly, the chip may be connected to the bonding pads by using a flip-chip packaging process or a fly wire bonding process.

Accordingly, the electrode diaphragm layer and the tuning capacitance layer may be formed of metal with a same thickness, and the RFID coil layer and the bonding pads may be formed of metal with a same thickness.

Accordingly, the carrier tape base layer may be formed of one or more of an FR-4 material, a CEM-3 material, a CEM-1 material, a 94HB material, a 94VO material, a polyvinyl chloride PVC, a polycarbonate PC, an acrylonitrile-butadiene-styrene copolymer ABS, a polyethylene terephthalate ester PET, a polyethylene terephthalateco-1,4-cylclohexylenedimethylene terephthalate PETG and a polyimide PI.

It follows that the embodiments of the present disclosure have the following beneficial effects.

With the embodiments of the present disclosure, the electrode diaphragm layer located on the front surface of the carrier tape is electrically connected to the bonding pads located on the back surface of the carrier tape through the metallized blind holes or through holes, such that the chip is connected to the electrode diaphragm layer by connecting the pins of the chip directly to the bonding pads. The process is simple. In this way, the chip can be packaged by using a flip-chip packaging process, a conventional fly wire bonding process or other chip packaging processes. The application range is wide.

The tuning capacitance layer is provided, such that no external capacitor is used. The RFID coil layer matches the tuning capacitance layer to adjust a contactless data transmission frequency of the carrier tape module, such that a contactless module of the carrier tape module can be connected to a contactless module of the base card by coupling. That is, according to the embodiment of the present disclosure, it is not necessary to connect the carrier tape module directly to the RFID antenna layer in the card base, thereby avoiding wire connection between the carrier tape chip and the card base and improving the production efficiency.

Therefore, with the embodiments of the present disclosure, the dual interface cards can be produced automatically on a large scale, and is completely applicable to readers and using methods of the conventional contact IC card and contactless card. In addition, the dual interface chip and the carrier tape module can be packaged by using a conventional fly wire bonding process or a flip-chip packaging process with a higher superiority, and is applicable to various types of present chip package devices. The fabricating process is simple, the cost is low, the production efficiency is high and the quality stability is good, thereby satisfying the market requirement of the dual interface card.

DETAILED DESCRIPTION OF EMBODIMENTS

In order to make the above objects, features and advantages of the present disclosure become more apparent and easier to be understood, embodiments of the present disclosure are further illustrated in detail in conjunction with the drawings and specific implementations hereinafter.

In the conventional technology, a dual interface card carrier tape module can be packaged by using only a fly wire bonding process. That is, pins of a chip are connected to an electrode diaphragm layer located on a front surface of the carrier tape through blind holes by using fly wires, and the process is complicated. Other chip package processes cannot be used. Further, in the conventional carrier tape module, two contactless metal contacts are connected to two end-points of an RFID antenna in a card base by manual welding, and thus the process is difficult, production efficiency is low, connection stability is poor, and a service life is short, failing to satisfy an applicant requirement. For the above technical problem, a multilayer wiring coupling dual interface card carrier tape module is provided according to an embodiment of the present disclosure. Specifically, the front surface of the carrier tape is electrically connected to the back surface of the carrier tape through metallized via holes, a chip located on the back surface of the carrier tape may be directly connected to a bonding pad located on the same plane, so as to be connected to an electrode diaphragm layer located on the front surface of the carrier tape; the chip can be packaged by the bonding pad by using a flip-chip packaging process, a conventional fly wire bonding process or other chip packaging processes, and the application range is wide. In addition, an RFID coil layer matches a tuning capacitance layer and may be connected to the RFID antenna in the card base by coupling, it does not need to connect the carrier tape module to the card base by manual welding, therefore the production efficiency is high and the dual interface cards can be produced automatically on a large scale.

Figure 1:
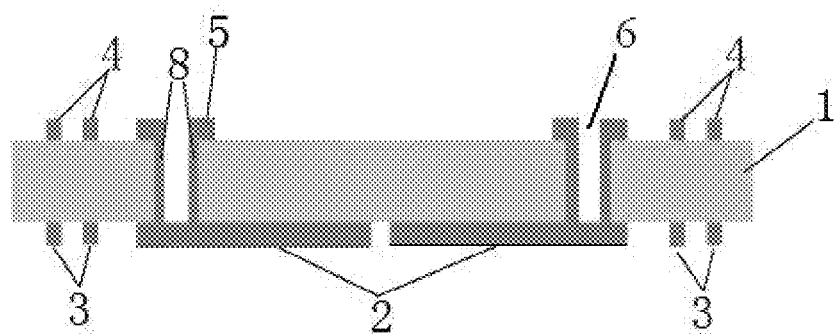
FIG. 1 is a schematic structural diagram of a multilayer wiring coupling dual interface card carrier tape module according to an embodiment of the present disclosure.

Reference is made to FIG. 1 which shows a multilayer wiring coupling dual interface card carrier tape module applicable in multiple chip package processes according to an embodiment of the present disclosure. The carrier tape module includes a carrier tape base layer 1, an electrode diaphragm layer 2, a tuning capacitance layer 3, a radio frequency identification RFID coil layer 4, bonding pads 5 and via holes 6.

The electrode diaphragm layer 2, the tuning capacitance layer 3, the carrier tape base layer 1, the RFID coil layer 4 and the bonding pads 5 may be formed as a whole, with both surfaces being clad with metal.

One surface of the carrier tape base layer 1 is a front surface of the carrier tape module, the other surface of the carrier tape base layer 1 is a back surface of the carrier tape module, the electrode diaphragm layer 2 and the tuning capacitance layer 3 are located on a same one plane, i.e., the front surface of the carrier tape base layer, and the RFID coil layer 4 and the bonding pads 5 are located on a same one plane, i.e., a back surface of the carrier tape base layer. The electrode diaphragm layer is configured to communicate data with a reader in a contact manner, and the RFID coil layer matches the tuning capacitance layer to adjust a contactless data transmission frequency of the carrier tape module.

The via hole is metallized for electrically connecting the electrode diaphragm layer located on the front surface of the carrier tape module with the bonding pad located on the back surface of the carrier tape module. The via hole is a blind hole extending from the bonding pad to the electrode diaphragm layer or a through hole extending from the bonding pad to the electrode diaphragm layer.

Figure 2:
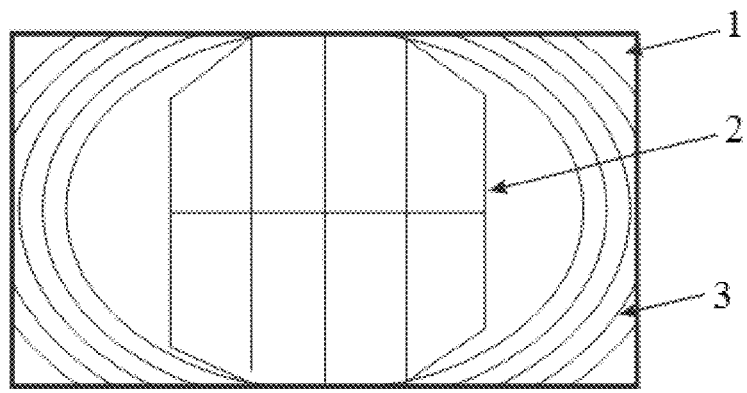
FIG. 2 is a schematic structural diagram of a front surface of a carrier tape module in a case that a via hole is a blind hole according to an embodiment of the present disclosure.
Figure 3:
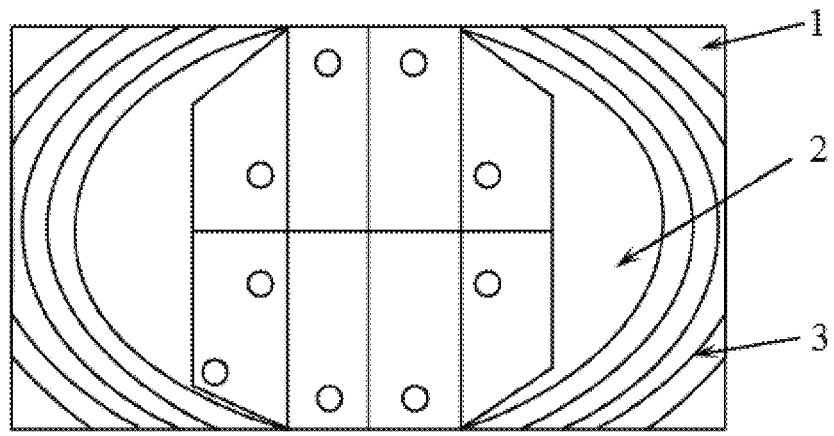
FIG. 3 is a schematic structural diagram of a front surface of a carrier tape module in a case that a via hole is a through hole according to an embodiment of the present disclosure.
Figure 4:
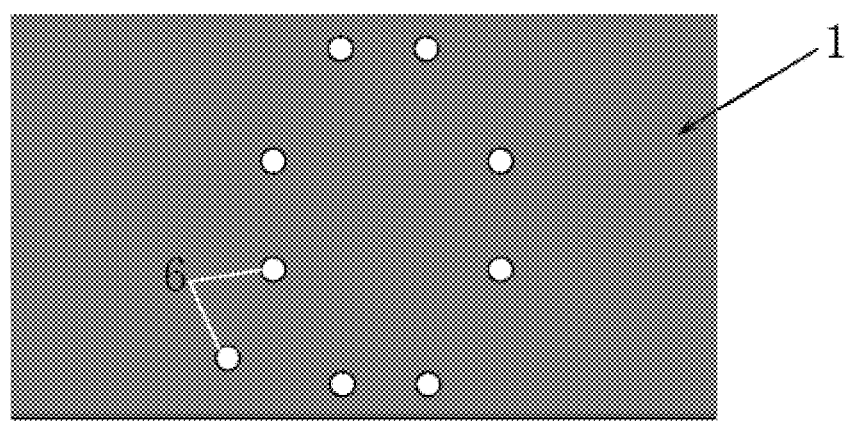
FIG. 4 is a schematic structural diagram of a carrier tape base layer according to an embodiment of the present disclosure.

In a case that the via hole is a blind hole, i.e., there is no hole in the electrode diaphragm layer, reference is made to FIG. 2 which shows a schematic diagram of a front surface of the carrier tape module. The electrode diaphragm layer 2 is located in a central region of the front surface of the carrier tape module and conforms to a corresponding standard, and the tuning capacitance layer 3 is arranged surrounding the electrode diaphragm layer 2. In a case that the via hole is a through hole, i.e., there is a hole in the electrode diaphragm layer, reference is made to FIG. 3 which shows a schematic diagram of the front surface of the carrier tape module. The electrode diaphragm layer 2 with the via holes 6 is located in a central region of the front surface of the carrier tape module and conforms to a corresponding standard, and the tuning capacitance layer 3 is arranged surrounding the electrode diaphragm layer 2. Accordingly, reference is made to FIG. 4 which shows a schematic structural diagram of the carrier tape base layer 1 with via holes 6.

Figure 5:
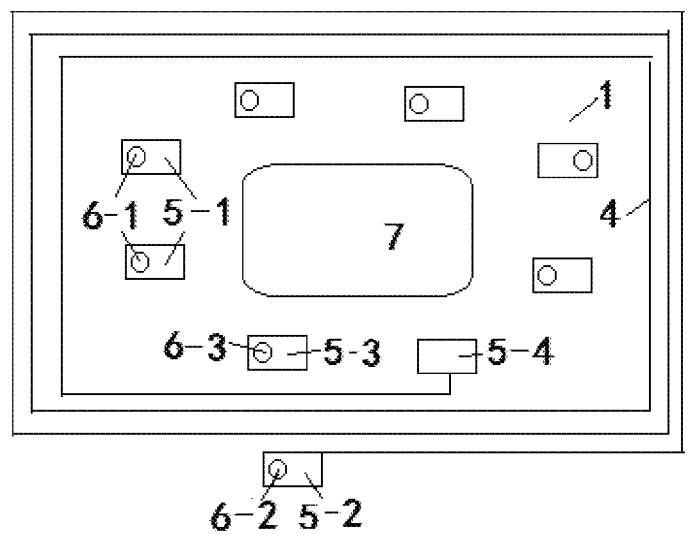
FIG. 5 is a schematic structural diagram of a back surface of a carrier tape module according to an embodiment of the present disclosure.

Reference is made to FIG. 5 which shows a schematic diagram of a back surface of the carrier tape module. The bonding pads 6 are arranged according to positions of pins of a chip, and a dual interface chip may be placed in a central region 7. In some embodiments of the present disclosure, the bonding pads 5 may include first bonding pads 5-1, a second bonding pad 5-2, a third bonding pad 5-3 and a fourth bonding pad 5-4, and accordingly, the via holes may include first via holes 6-1, second via holes 6-2 and third via-holes 6-3.

The first via holes 6-1 are located in the first bonding pads 5-1, the second via holes 6-2 are located in the second bonding pad 5-2, and the third via holes 6-3 are located in the third bonding pad 5-3. The number of the first bonding pads 5-1 ranges from 5 to 8 and may be determined according to actual cases. Each of the first bonding pads 5-1 corresponds to a group of the first via holes 6-1, and each of the first bonding pads 5-1 is connected to different metal contact blocks on the electrode diaphragm layer via the corresponding first via holes 6-1. The second bonding pad 5-2 may correspond to a group of the second via holes 6-2, and the third bonding pad 5-3 may correspond to a group of the third via holes 6-3.

The second bonding pad 5-2 is connected to an outer endpoint of the RFID coil layer and the fourth bonding pad 5-4 is connected to an inner endpoint of the RFID coil layer. There is no via hole in the fourth bonding pad 5-4. The second bonding pad 5-2 and the third bonding pad 5-3 are connected to a same one metal contact block on the electrode diaphragm layer via the second via holes 6-2 and the third via holes 6-3 respectively.

Specifically, each group of first via holes 6-1 are connected to corresponding contact blocks on the electrode diaphragm layer 2 located on the front surface of the carrier tape module, thereby electrically connecting the electrode diaphragm layer 2 located on the front surface of the carrier tape module to the bonding pad 5 located on the back surface of the carrier tape module. A group of second via holes 6-2 electrically connect corresponding contact blocks on the electrode diaphragm layer 2 located on the front surface of the carrier tape module to the outer endpoint of the RFID coil layer 4 and the second bonding pad 5-2 located on the back surface of the carrier tape module. A group of third via holes 6-3 electrically connect corresponding contact blocks on the electrode diaphragm layer 2 located on the front surface of the carrier tape module to the third bonding pad 5-3 located on the back surface of the carrier tape module. Through the second via holes 6-2 and the third via holes 6-3, the third bonding pad 5-3, the outer endpoint of the RFID coil layer 4 and the second bonding pad 5-2 are connected integrally. The third bonding pad 5-4 is connected to an inner endpoint of the RFID coil layer 4. Therefore, the tuning capacitance layer 3 and the RFID coil layer 4 can match each other, thereby satisfying a design frequency for a contactless RFID label required by coupling the dual interface card carrier tape module.

The dual interface chip is placed in a central region 7 of the back surface of the carrier tape. Positions of the first bonding pads 5-1, the third bonding pad 5-3 and the fourth bonding pad 5-4 are determined according to positions of pins of the used dual interface chip and requirements of metal contact blocks on the electrode diaphragm layer 2. Each of the first bonding pads 5-1 is configured to electrically connect to respective contact pins of the dual interface chip and is connected to the electrode diaphragm layer 2 via the first via hole 6-1, such that the dual interface chip is connected to an external reader by contacting, so as to transmit data, thereby achieving a function of a contact IC card. A contact interface of the dual interface card conforms to a standard of ISO/IEC7816 of the contact IC card.

The third bonding pad 5-3 and the fourth bonding pad 5-4 are electrically connected to two contactless pins of the dual interface chip. A contactless interface of the dual interface card conforms to a standard of ISO/IEC15693 or a standard of ISO11784/ISO11785.

In some embodiments of the present disclosure, the number of the via holes in the group ranges from 1 to 5 depending on a diameter of the via hole. The diameter of the via hole is inversely proportionally to the number of a group of via holes, that is, the smaller the diameter of the via hole is, the greater the number of the via holes is, so as to enhance stability of electrical connection between the bonding pad and the electrode diaphragm layer. The diameter of the via hole may range from 0.1 mm to 2 mm.

Figure 6:
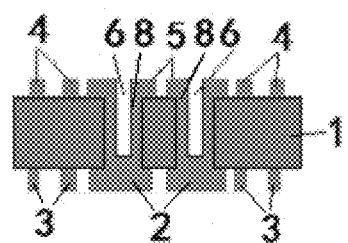
FIG. 6 is a schematic structural diagram of a blind hole which has been metallized according to an embodiment of the present disclosure.
Figure 7:
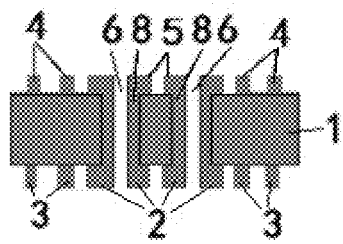
FIG. 7 is a schematic structural diagram of a through hole which has been metallized according to an embodiment of the present disclosure.

Reference is made to FIG. 6 and FIG. 7 which show two structures of the via holes 6. In FIG. 6, the via hole is a blind hole which is metallized, and in FIG. 7, the via hole is a through hole which is metallized. Coated metal 8 on a hole wall connects an upper metal layer (the electrode diaphragm layer) 2 and a lower metal layer (the bonding pad) 5 of the hole.

In some embodiments of the present disclosure, the via hole 6 may be formed by using a mechanical mold, a laser engraving technology or other conventional via hole technology.

In some embodiments of the present disclosure, the chip may be connected to the bonding pad by using a flip-chip packaging process, a fly wire bonding process or other chip packaging processes.

Figure 8:
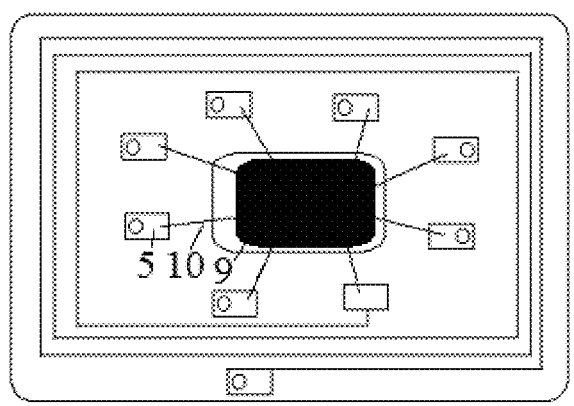
FIG. 8 is a schematic planar structural diagram of a flip-chip packaging process according to an embodiment of the present disclosure.
Figure 9:
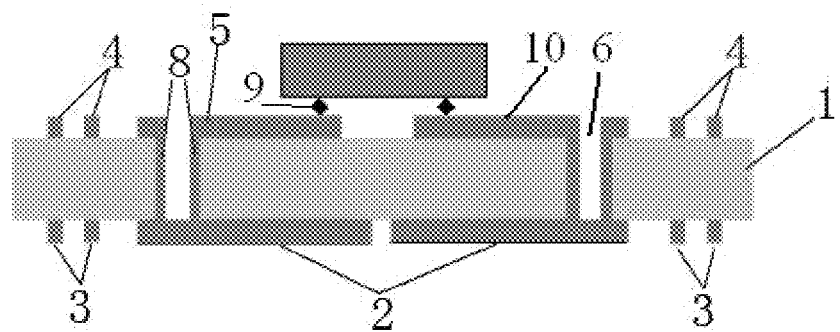
FIG. 9 is a schematic sectional structural diagram of a flip-chip packaging process according to an embodiment of the present disclosure.

Preferably, the carrier tape module is packaged by using the flip-chip packaging process which is convenient, quick and has good performances. As shown in FIG. 8 and FIG. 9, FIG. 8 shows a planar structural diagram of a flip-chip packaging process and FIG. 9 shows a sectional structural diagram of a flip-chip packaging process. The dual interface chip may be inverted on the carrier tape module, that is, pins 9 of the chip are towards the inside, and are electrically connected to the bonding pads 5 located on the back surface of the carrier tape module via a conductor 10 printed by a solder paste or other conductors 10.

Figure 10:
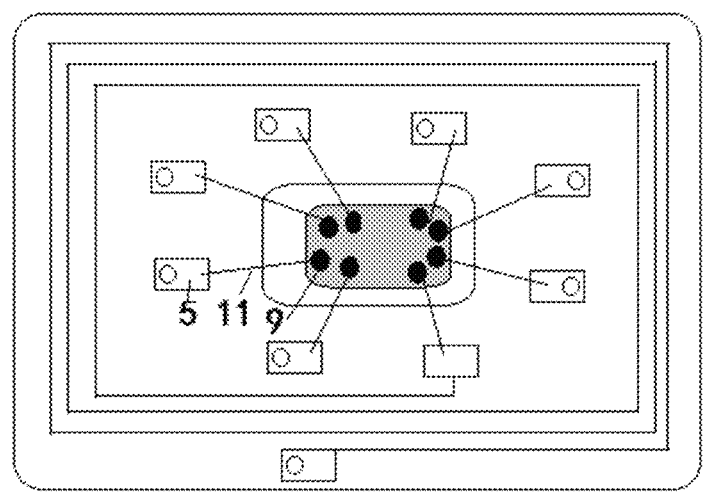
FIG. 10 is a schematic planar structural diagram of a fly wire bonding process according to an embodiment of the present disclosure.
Figure 11:
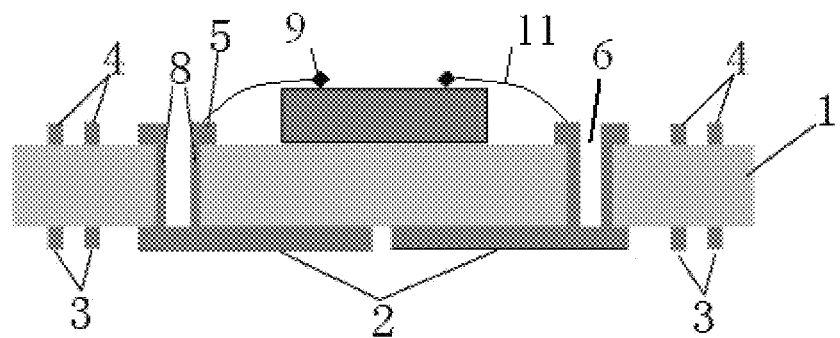
FIG. 11 is a schematic sectional structural diagram of a fly wire bonding process according to an embodiment of the present disclosure.
Figure 12:
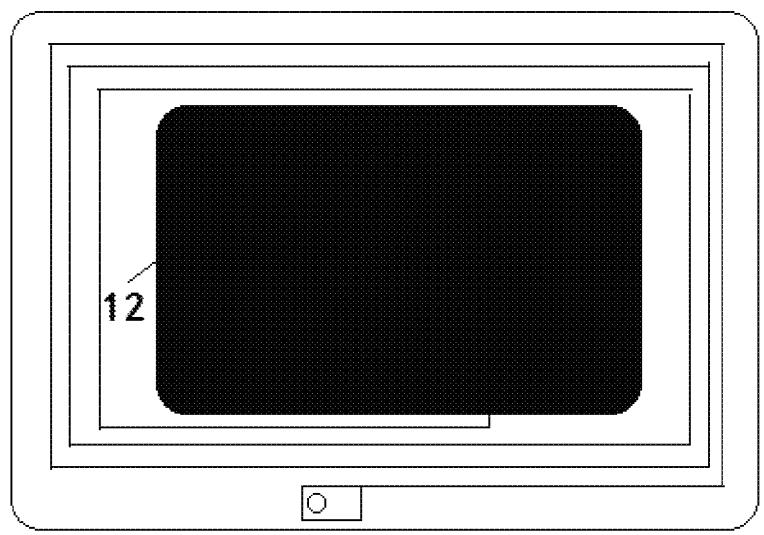
FIG. 12 is a schematic structural diagram of a molded package using a fly wire bonding process according to an embodiment of the present disclosure.

The dual interface chip and the carrier tape module according to the embodiment of the present disclosure may also be packaged by using the conventional fly wire bonding process. As shown in FIG. 10 and FIG. 11, FIG. 10 is a planar structural diagram of a fly wire bonding process, and FIG. 11 is a sectional structural diagram of a fly wire bonding process. The dual interface chip may be forwardly placed on the carrier tape module, that is, the pins 9 of the chip are towards the outside, and the pins 9 of the chip are connected to the bonding pads 5 via gold wires 11. As shown in FIG. 12, after the fly wire bonding is performed, plastic molded package is to be performed, that is, the chip, the gold wires 11 and the bonding pads 5 are sealed using a package 12 such as a UV glue, plastics, ceramics or a rubber.

In some embodiments of the present disclosure, the electrode diaphragm layer and the tuning capacitance layer may be formed of metal with a same thickness, and the RFID coil layer and the bonding pad may be formed of metal with a same thickness.

In some embodiments of the present disclosure, the carrier tape base layer may be formed of one or more of an FR-4 material, a CEM-3 material, a CEM-1 material, a 94HB material, a 94VO material, a polyvinyl chloride PVC, a polycarbonate PC, an acrylonitrile-butadiene-styrene copolymer ABS, a polyethylene terephthalate ester PET, a polyethylene terephthalateco-1,4-cylclohexylenedimethylene terephthalates PETG and a polyimide PI.

With the embodiments of the present disclosure, the electrode diaphragm layer located on the front surface of the carrier tape is electrically connected to the bonding pads located on the back surface of the carrier tape through metallized blind holes or through holes, such that the chip can be connected to the electrode diaphragm layer by connecting the pins of the chip directly to the bonding pads. The process is simple, and bridge design is avoided in the RFID coil layer. In this way, the chip can be packaged by using a flip-chip packaging process, a conventional fly wire bonding process or other chip packaging processes. The application range is wide.

The tuning capacitance layer is provided, such that no external capacitor is used. The RFID coil layer matches the tuning capacitance layer to adjust a contactless data transmission frequency of the carrier tape module, such that a contactless module of the carrier tape module can be connected to a contactless module of the base card by coupling. That is, according to the embodiment of the present disclosure, it is not necessary to connect the carrier tape module directly to the RFID antenna layer in the card base, thereby avoiding wire connection between the carrier tape chip and the card base and improving the production efficiency.

Therefore, with the embodiments of the present disclosure, the dual interface cards can be produced automatically on a large scale, and is completely applicable to readers and using methods of the conventional contact IC card and contactless card. In addition, the dual interface chip and the carrier tape module can be packaged by using a conventional fly wire bonding process or a flip-chip packaging process with a higher superiority, and is applicable to various types of present chip package devices. The fabricating process is simple, the cost is low, the production efficiency is high and the quality stability is good, thereby satisfying the market requirement of the dual interface card.

It should be noted that, various embodiments of the specification are described in a progressive manner, and each embodiment lays emphasis on differences from other embodiments. The same or similar parts between various embodiments may be referred to each other.

It should be further noted that the relationship terminologies such as "first", "second" and the like are only used herein to distinguish one entity or operation from another, rather than to necessitate or imply that the actual relationship or order exists between the entities or operations. Furthermore, terms of "include", "comprise" or any other variants are intended to be non-exclusive. Therefore, a process, method, article or device including a plurality of elements includes not only the elements but also other elements that are not enumerated, or also include the elements inherent for the process, method, article or device. Unless expressively limited otherwise, the statement "comprising (including) one . . . " does not exclude the case that other similar elements may exist in the process, method, article or device.

Steps of the method or algorithm described in conjunction with the embodiments disclosed herein may be implemented by hardware, a software module executed by a processor or a combination thereof. The software module may be arranged in a random access memory (RAM), a memory, a read only memory (ROM), an electrically programmable ROM, an electrically programmable erasable ROM, a register, a hard disk, a movable hard disk, a CD-ROM or any other form of storage medium well-known for those skilled in the art.

The description of the disclosed embodiments can enable those skilled in the art to practice or use the present disclosure. Many changes to the embodiments are apparent for those skilled in the art, and general principles defined herein may be implemented in other embodiments without departing from the spirit or scope of the present disclosure. Therefore, the present disclosure is not limited by the embodiments disclosed herein, but to conform to the widest scope in accordance with the principles and novel features disclosed herein.

The invention claimed is:

1. A multilayer wiring coupling dual interface card carrier tape module, comprising:
   a carrier tape base layer, an electrode diaphragm layer, a tuning capacitance layer, a radio frequency identification RFID coil layer, bonding pads and via holes, wherein
   the electrode diaphragm layer, the tuning capacitance layer, the carrier tape base layer, the RFID coil layer and the bonding pads are formed as a whole, with both surfaces being clad with metal;
   one surface of the carrier tape base layer is a front surface of the carrier tape module, the other surface of the carrier tape base layer is a back surface of the carrier tape module, the electrode diaphragm layer and the tuning capacitance layer are located on a front surface of the carrier tape base layer, and the RFID coil layer and the bonding pads are located on a back surface of the carrier tape base layer;
   the bonding pads are arranged according to positions of pins of a chip;
   the via holes are metallized for electrically connecting the electrode diaphragm layer located on the front surface of the carrier tape module with the bonding pads located on the back surface of the carrier tape module;
   the electrode diaphragm layer is configured to transmit data in a contact manner; and
   the RFID coil layer matches the tuning capacitance layer to adjust a contactless data transmission frequency of the carrier tape module;
   the bonding pads comprise first bonding pads, a second bonding pad, a third bonding pad and a fourth bonding pad, and the via holes comprise first via holes, second via holes and third via holes;
   the first via holes are located in the first bonding pads, the second via holes are located in the second bonding pad, and the third via holes are located in the third bonding pad; and
   the second bonding pad is connected to an outer endpoint of the RFID coil layer, the fourth bonding pad is connected to an inner endpoint of the RFID coil layer, the second bonding pad and the third bonding pad are connected to a same one metal contact block on the electrode diaphragm layer via the second via holes and the third via holes respectively, and the first bonding pads are connected to other metal contact blocks on the electrode diaphragm layer via the first via holes.

2. The multilayer wiring coupling dual interface card carrier tape module according to claim 1, wherein
   the number of the first bonding pads ranges from 5 to 8, each of the first bonding pads corresponds to a group of the first via holes, each of the first bonding pads is connected to different metal contact blocks on the electrode diaphragm layer via the corresponding first via holes;
   the second bonding pad corresponds to a group of the second via holes; and
   the third bonding pad corresponds to a group of the third via holes.

3. The multiplayer wiring coupling dual interface card carrier tape module according to claim 2, wherein the number of the via holes in the group ranges from 1 to 5 depending on a diameter of the via hole, and the diameter of the via hole is inversely proportional to the number of the via holes in the group, to enhance stability of electrical connection between the bonding pads and the electrode diaphragm layer.

4. The multilayer wiring coupling dual interface card carrier tape module according to claim 3, wherein the diameter of the via hole ranges from 0.1 mm to 2 mm.

5. The multilayer wiring coupling dual interface card carrier tape module according to claim 4, wherein the via hole is a blind hole extending from the bonding pad to the electrode diaphragm layer, or a through hole extending from the bonding pad to the electrode diaphragm layer.

6. The multilayer wiring coupling dual interface card carrier tape module according to claim 5, wherein the via hole is formed by using a mechanical mold, a laser engraving technology or a conventional via hole technology.

7. The multilayer wiring coupling dual interface card carrier tape module according to claim 3, wherein the via hole is a blind hole extending from the bonding pad to the electrode diaphragm layer, or a through hole extending from the bonding pad to the electrode diaphragm layer.

8. The multilayer wiring coupling dual interface card carrier tape module according to claim 7, wherein the via hole is formed by using a mechanical mold, a laser engraving technology or a conventional via hole technology.

9. The multilayer wiring coupling dual interface card carrier tape module according to claim 2, wherein the via hole is a blind hole extending from the bonding pad to the electrode diaphragm layer, or a through hole extending from the bonding pad to the electrode diaphragm layer.

10. The multilayer wiring coupling dual interface card carrier tape module according to claim 9, wherein the via hole is formed by using a mechanical mold, a laser engraving technology or a conventional via hole technology.

11. The multilayer wiring coupling dual interface card carrier tape module according to claim 1, wherein the via hole is a blind hole extending from the bonding pad to the electrode diaphragm layer, or a through hole extending from the bonding pad to the electrode diaphragm layer.

12. The multilayer wiring coupling dual interface card carrier tape module according to claim 11, wherein the via hole is formed by using a mechanical mold, a laser engraving technology or a conventional via hole technology.

13. The multilayer wiring coupling dual interface card carrier tape module according to claim 1, wherein the chip is connected to the bonding pads by using a flip-chip packaging process or a fly wire bonding process.

14. The multilayer wiring coupling dual interface card carrier tape module according to claim 1, wherein the electrode diaphragm layer and the tuning capacitance layer are formed of metal with a same thickness, and the RFID coil layer and the bonding pads are formed of metal with a same thickness.

15. The multiplayer wiring coupling dual interface card carrier tape module according to claim 1, wherein the carrier tape base layer is formed of one or more of an FR-4 material, a CEM-3 material, a CEM-1 material, a 94HB material, a 94VO material, a polyvinyl chloride PVC, a polycarbonate PC, an acrylonitrile-butadiene-styrene copolymer ABS, a polyethylene terephthalate ester PET, a polyethylene terephthalateco-1,4-cylclohexylenedimethylene terephthalate PETG and a polyimide PI.

* * * * *